United States Patent
Miao et al.

(10) Patent No.: US 7,640,471 B2
(45) Date of Patent: Dec. 29, 2009

(54) ON-BOARD FIFO MEMORY MODULE FOR HIGH SPEED DIGITAL SOURCING AND CAPTURE TO/FROM DUT (DEVICE UNDER TEST) USING A CLOCK FROM DUT

(75) Inventors: Yu Miao, Plano, TX (US); Elizabeth Vigrass, Allen, TX (US); Shawn C. Smith, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 393 days.

(21) Appl. No.: 11/580,761

(22) Filed: Oct. 13, 2006

(65) Prior Publication Data
US 2008/0091993 A1 Apr. 17, 2008

(51) Int. Cl.
*G01R 31/28* (2006.01)
(52) U.S. Cl. .................. 714/724; 714/731; 714/744
(58) Field of Classification Search .............. 714/724, 714/731, 744
See application file for complete search history.

(56) References Cited

U.S. PATENT DOCUMENTS

| | | | |
|---|---|---|---|
| 6,571,357 B1 * | 5/2003 | Martin et al. | 714/28 |
| 6,904,375 B1 * | 6/2005 | Sabih et al. | 702/75 |
| 7,096,141 B2 * | 8/2006 | Bohan | 702/122 |
| 7,327,153 B2 * | 2/2008 | Weinraub | 324/763 |
| 7,437,262 B2 * | 10/2008 | Boose et al. | 702/122 |
| 7,472,321 B2 * | 12/2008 | Chun | 714/724 |
| 2005/0044445 A1 | 2/2005 | Boose et al. | |
| 2005/0055615 A1 | 3/2005 | Agashe et al. | |
| 2005/0060612 A1 | 3/2005 | Bohan | |

* cited by examiner

*Primary Examiner*—John J Tabone, Jr.
(74) *Attorney, Agent, or Firm*—Yingsheng Tung; Wade J. Brady, III; Frederick J. Telecky, Jr.

(57) ABSTRACT

In a method and system for testing, a tester (110) is operable to communicate test signals (124, 126) at a tester clock speed, and a device (190) to be tested is operable to communicate the test signals (124, 126) at a device clock speed, the device clock speed being greater than the tester clock speed. A test module (120) is interposed between the tester (110) and the device (190) to enable data transfer between the tester (110) and the device (190) at their respective clock speeds. The test module (120) includes a memory module (250) capable of storing N samples of the test signals (124, 126) at a selectable one of the tester clock speed and the device clock speed. The memory module (250) is operable to provide the N samples at a selectable one of the tester clock speed and the device clock speed.

14 Claims, 3 Drawing Sheets

ON-BOARD FIFO MEMORY MODULE FOR HIGH SPEED DIGITAL SOURCING AND CAPTURE TO/FROM DUT (DEVICE UNDER TEST) USING A CLOCK FROM DUT

BACKGROUND

The present disclosure relates generally to test systems, and more particularly to a system and method for improving communications between a device under test (DUT) and a tester.

The increasing functional complexity of electronic components and systems has made integrated circuit (IC) testing challenging, particularly under the constraints of making a continuous improvement in quality and a continuous reduction in cost. The cost of manufacturing a transistor continues to improve as predicted by Moore's Law. Test costs, however, have not generally followed the same price/performance curve as the transistor and are therefore becoming a higher percentage of the total manufacturing cost of a chip.

Today, manufacturers of automatic test equipment (ATE) offer test systems to address the increasingly complex task of testing advanced multi-function, ICs such as system-on-a-chip (SoC). However, many commercially available ATE systems are complex, proprietary, not easily flexible to meet changing test conditions, often require additional heat removal systems, and typically cost several million dollars, thereby making them unattractive for use in a cost driven manufacturing environment. Recently, many semiconductor manufacturers, and some ATE suppliers have introduced low cost test systems such as a very low cost tester (VLCT). The VLCT system may be used as a standalone test system, or used in combination with a conventional ATE system. The VLCT systems typically provide lower test costs, and are more flexible in meeting the changing test conditions, making them more attractive in the cost driven manufacturing environment.

VLCT systems may be used for performing mixed signal (e.g., analog and digital) testing, which may include radio frequency (RF) analog signals and high speed digital signals. However, due to cost considerations, many of the VLCT systems may provide a limited amount of performance, and may have a limited capacity. For example, some VLCT systems may have a limited data throughput for testing, e.g., the systems may include a clock that is limited to 30 megahertz (MHz) frequency. These VLCT systems may be unable to perform high speed digital signal data capture or data sourcing for testing high speed chips having clock rates greater than 30 MHz.

Some of these limitations may result in operating the VLCT at the lower clock speeds, e.g., 30 MHz, thereby increasing the time, and reducing the efficiency to test each DUT. The mismatch in clock speeds may cause problems in maintaining time synchronization between the VLCT and the DUT. The additional time needed for testing each DUT at the lower clock speed is magnified at the manufacturing process level when millions of DUT's may be tested in a day. As a result, some of the limitations of the VLCT systems may inadvertently slow down the production rate, and may contribute to an overall increase in the cost of testing.

SUMMARY

Applicants recognize an existing need for an improved method and system for testing high speed DUT's with a VLCT; and the need for reliably, consistently, and cost effectively performing high speed data capture and data sourcing between the DUT and the VLCT, especially when the clock rate of the DUT exceeds the limitations of the VLCT, absent the disadvantages found in the prior techniques discussed above.

The foregoing need is addressed by the teachings of the present disclosure, which relates to a system and method for testing a device. According to one embodiment, in a method and system for testing, a tester is operable to communicate test signals at a tester clock speed, and a device to be tested is operable to communicate the test signals at a device clock speed, the device clock speed being greater than the tester clock speed. A test module is interposed between the tester and the device to enable data transfer between tester and the device at their respective clock speeds. The test module includes a memory module capable of storing N samples of the test signals at a selectable one of the tester clock speed and the device clock speed. The memory module is operable to provide the N samples at a selectable one of the tester clock speed and the device clock speed.

In one aspect of the disclosure, a test module for testing a device includes a device interface capable of communicating with the device at a device clock speed, and a tester interface capable of communicating with a tester at a tester clock speed. A bus electrically couples the device interface and the tester interface. The bus is operable to communicate test signals between the device and the tester at a selectable one of the tester clock speed and the device clock speed. A memory module coupled to the bus is operable to read or write the test signals at one of the tester clock speed and the device clock speed. A controller controls the flow of the test signals through the device interface and the tester interface. The device interface is disabled when the bus operates at the tester clock speed, and the tester interface is disabled when the bus operates at the device clock speed. Thus, the test module enables data transfer between tester and the device at their respective clock speeds.

Several advantages are achieved by the method and system according to the illustrative embodiments presented herein. The embodiments advantageously provide a VLCT with a test module to reliably, consistently, and efficiently capture or source high speed data for testing a DUT, especially when the clock rate of the DUT exceeds the limitations of the VLCT. By receiving, and storing samples of the test signals, the test module advantageously decouples time synchronization between the DUT, and the VLCT by delivering the stored samples at a clock rate matching the 'at speed' clock rate of the DUT or the VLCT tester. This advantageously enables at speed communication with the tester as well as with the DUT, thereby enabling the at speed testing of analog-to-digital converters (ADC) and digital-to-analog converters (DAC) included in the device. The test module may also be advantageously be used with high speed testers to advantageously decouple time synchronization between the DUT and the high speed tester, and avoid failures if the DUT clock has jitter (has abrupt and undesirable variations in one or more clock signal characteristics). The test module thus virtually eliminates need to synchronize clocks between DUT and the high speed tester. Chip manufacturing facilities may add the improved test module to a new or a legacy test system or to both to obtain reliable test data and reduce the overall test time, thereby reducing the overall testing costs, and enabling increased production.

DETAILED DESCRIPTION

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) or software or a combination thereof, depending on the application requirements.

Many commercially available, advanced, multi-function test systems are often very complex, bulky, and typically cost several million dollars. Some of the VLCT systems may offer more flexibility, and may be less costly but may be limited by their performance, and capacity. The performance and capacity limitation of the VLCT, e.g., a maximum tester clock rate of 30 MHz, may negatively impact the production rate for manufacturing the DUT, thereby increasing the overall cost of testing. Some of these VLCT systems may be unable to perform high speed digital signal data capture, or data sourcing for 'at speed' testing of chips having clock rates greater than 30 MHz. The mismatch in clock rates between the DUT and the VLCT often causes time synchronization problems, which may reduce reliability, and consistency of captured, of sourced data or of both. For example, variability of plus or minus 5 nanoseconds in the clock may result in a corruption of the data. This problem may be addressed by an improved system and method to test a device, especially in a manufacturing environment. In the improved system and method, a test module interfaces with the VLCT by communicating test signals at the VLCT clock speed, and with the DUT at the device clock speed. By receiving, and storing samples of the test signals, the test module advantageously decouples time synchronization between the DUT, and the VLCT by delivering the stored samples at a clock rate matching the 'at speed' clock rate of the DUT or the tester.

According to one embodiment, in a method and system for testing, a tester is operable to communicate test signals at a tester clock speed, and a device to be tested is operable to communicate the test signals at a device clock speed, the device clock speed being greater than the tester clock speed. A test module is interposed between the tester and the device to enable data transfer between tester and the device at their respective clock speeds. The test module includes a memory module capable of storing N samples of the test signals at a selectable one of the tester clock speed and the device clock speed. The memory module is operable to provide the N samples at a selectable one of the tester clock speed and the device clock speed.

Figures 1, 2B:
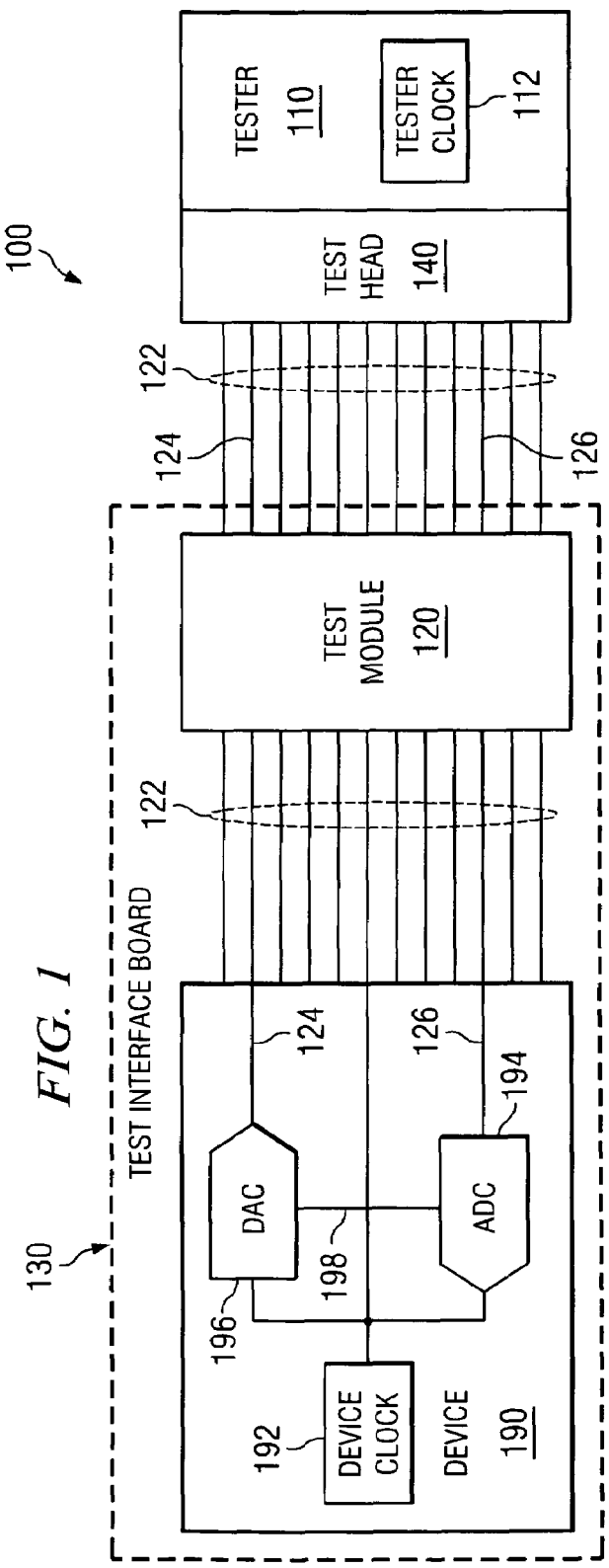
FIG. 1 illustrates an improved test system for testing a device, according to an embodiment.
FIG. 2B illustrates a plurality of operating modes of a test module described with reference to FIGS. 1 and 2A, according to an embodiment.

FIG. 1 illustrates a block diagram of an improved test system 100 for testing a device 190, according to an embodiment. The test system 100 is configured to operate in a plurality of operating modes. In a source mode, the tester 110 is operable to provide one or more test signals to the device 190 through a test module 120. The device 190 may also be referred to as a device under test (DUT). When operating in a capture mode, the tester 110 is configured to receive one or more responses (or response signals) to the test signals from the device 190 through the test module 120. In order to reduce the harmful effects of noise, attenuation, electromagnetic interference, and similar others on high speed test signals and clock signals, it is desirable to reduce a distance between the device 190 and the test module 120, and to use shielded cables for the connection. A distance traveled by high speed test signals and clock signals, e.g., distance between the device 190 and the test module 120, is preferably limited to 1 meter or less. In a particular embodiment, the device 190 and the test module 120 are both mounted on a test interface board (TIB) 130 (also referred to simply as an interface board), which in turn is removably secured to a test head 140, e.g., secured to the test head 140 in a removable manner. In an alternative embodiment, the test module (120) may be integrated into the design of the TIB 130 along with other components such as relays to further reduce the distance. In a non-depicted exemplary embodiment, the test module 120 and the device 190 may be both mounted on a device interface board (DIB), which may be secured to the TIB 130 in a removable manner.

Depending on the size and complexity of the test system 100, the test head 140 may include several hundred to several thousand electrical connectors for electrically coupling the tester 110 to the device 190. Test signals generated by the tester 110 are communicated to the device 190 via the test head 140, the test module 120, and one or more electrical couplers 122 (such as conductors, cables, lines, pins, links, traces, buses, and the like). Different DUT's may require a corresponding matching TIB or a DIB. The size, layout and arrangement of the test head may vary by manufacturer of the tester.

In an embodiment, the test system 100 includes a very low cost test (VLCT) system, which may be limited to several hundred input/output (I/O) channels or connections between the tester 110 and the device 190. In a particular embodiment, the tester 110 is a VLCT having limited performance. The VLCT limitations may include limited clock rate, memory size, number of scan I/O chains, and similar others. For example, as described earlier, the tester clock speed may be limited to 30 MHz or less, and the number of scan I/O chains may be limited to eight.

In a particular embodiment, the tester 110 includes stimuli logic to provide the one or more test signals to the device 190, compare logic to receive the response signals from the device 190, and decision logic to determine whether the device 190 passes or fails the testing. Execution of the logic results in applying test stimuli (also referred to as test vectors) to the device 190. The test vectors for a particular test may define a sequence of fixed input values and expected output values for a circuit being tested. If the response from the device 190 to the test stimuli does not match the expected output values then the device 190 may be identified as being defective. Test related data such as pass/fail results, time/event data, diagnostic data, and logging data may be provided to a computer or workstation (not shown) for further analysis.

In a particular embodiment, the one or more test signals may include various well known test signals types including alternating current (AC), direct current (DC), analog, digital, time, frequency, synchronous, asynchronous, pulse, clock and similar others. In an embodiment, the one or more test signals include a DC power signal to power the device 190, and a low speed digital signal having a frequency less than approximately 30 megahertz (MHz).

In a particular embodiment, the tester 110 includes a tester clock 112 having a selectable tester clock speed not to exceed 30 MHz. The device 190 includes a device clock 192 having a selectable device clock speed, which may vary between 1 KHz to approximately 500 MHz. When the device 190 operates at a high clock speed, e.g., at speed, the device clock speed is greater than the tester clock speed. In a particular embodiment, the device clock speed of the device clock 192 may be selected to be at least 30 MHz but less than approximately 500 MHz. The specific range of values for the clock speed may change with technology.

In a particular embodiment, the test module 120 is operable to communicate with the tester 110 at the tester clock speed, and to communicate with the device 190 at the device clock speed, depending on the operating mode of the test system 100 and a corresponding operating mode of the test module 120. That is, test signals provided by the tester 110 or response signals provided to the tester 110 are communicated at the tester clock speed. Similarly, test signals provided to the device 190 or response signals received from the device 190 are communicated at the device clock speed. Additional details of the test module 120 are described with reference to FIG. 2A, and additional details of the plurality of operating modes of the test module 120 are described with reference to FIG. 2B.

In a particular embodiment, the device 190 includes an analog-to-digital converter (ADC) 194 and a digital-to-analog converter (DAC) 196. When the test system 100 is operating in a source mode, the test module 120 receives a first plurality of test signals 124 from the tester 110 operating at the tester clock speed, stores the received signals, and provides the stored value of the first plurality of test signals 124 to the DAC 196 of device 190 selected to operate at a device clock speed of approximately 160 MHz. An output 198 of the DAC 196 may be compared against a reference to determine pass/fail status.

When the test system 100 is operating in a capture mode, the test module 120 receives a second plurality of test signals 126 from device 190 at the device clock speed, e.g., selected at 80 MHz, stores the received signals, and provides the stored value of the second plurality of test signals 126 to tester 110 at the tester clock speed. In an embodiment, the first plurality of test signals 124 may be provided to the DAC 196 to generate the analog output 198. The analog output 198 is provided to the ADC 194, converted to the second plurality of test signals 126, and captured back by the tester 110 for comparison. Additional details of the test module 120 are described with reference to FIGS. 2A and 2B.

In an embodiment, the device 190 is one of a microprocessor, a digital signal processor, a radio frequency chip, a memory, a microcontroller, and a system-on-a-chip or a combination thereof.

Figure 2A:
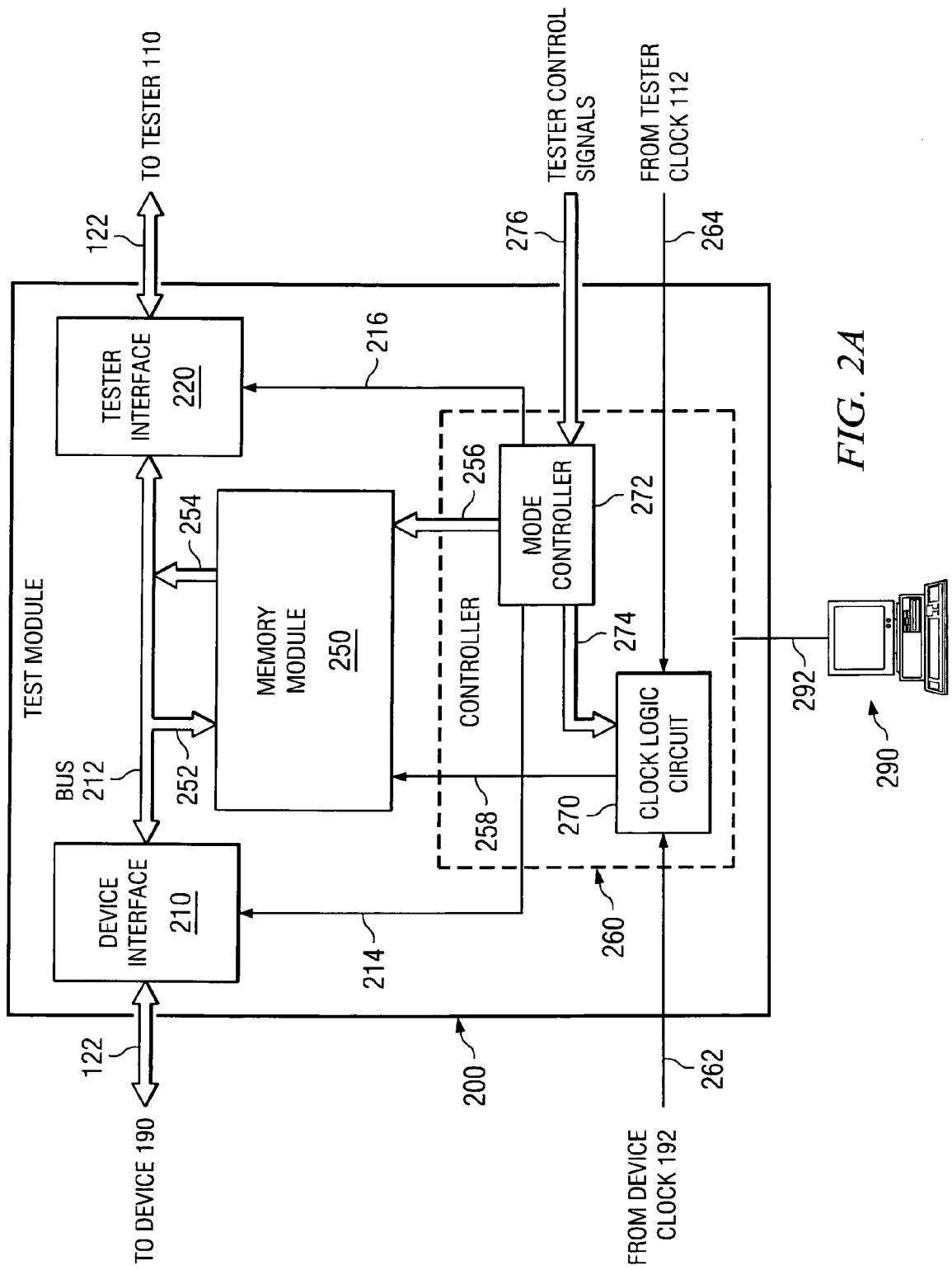
FIG. 2A is a block diagram illustrating additional details of a test module, according to an embodiment.

FIG. 2A is a block diagram illustrating details of a test module 200, according to an embodiment. In an embodiment, the test module 200 is substantially the same as the test module 120 described with reference to FIG. 1. In the embodiment, the test module 200 is properly shielded and grounded to reduce effects of electromagnetic interference (EMI), radio frequency interference (RFI), and similar others. In the depicted embodiment, the test module 200 includes a device interface 210 coupled to the device 190 by the electrical couplers 122, and a tester interface 220 coupled to the tester 110 by the electrical couplers 122. As described earlier, the electrical couplers 122 may include conductors, cables, lines, pins, links, traces, buses, and the like).

The device interface 210 and the tester interface 220 are coupled to each other by a bus 212. In an embodiment, the bus 212 supports bi-directional communications (or data or signal transfer) between the device interface 210 and the tester interface 220 to perform selected tests such as continuity, parameter, and boundary scan test. The bus 212 is operable at the speed of the device clock 192 to perform at speed digital capture, and at the speed of the tester clock 112 to perform source testing. The tester interface 220 is operable to receive the first plurality of test signals 124 from the tester 110 at a tester clock speed, and the device interface 210 is operable to receive the second plurality of test signals 126 from the device 190 at a device clock speed. The first and second plurality of test signals 124 and 126 may be simply referred to as test signals.

In the depicted embodiment, the device interface 210 includes circuits to perform communication functions such as receiving and transmitting and signal processing functions such as signal level shifting. The device interface 210 is controlled by a control signal 214. In an exemplary, non-depicted embodiment, the device interface 210 includes a transmit device buffer and a receive device buffer that are operable to process the first and second plurality of test signals 124 and 126. The processing of the first and second plurality of test signals 124 and 126 may include performing signal processing functions such as level shifting. In an embodiment, the control signal 214 may be used to disable the device interface 210. The disabling of the device interface 210 results in disabling a flow of test signals between the device interface 210 and the device 190 by creating a high impedance between the two.

Similarly, the tester interface 220 may include circuits to perform communication functions such as receiving and transmitting and signal processing functions. The tester interface 220 is controlled by a control signal 216. In an exemplary, non-depicted embodiment, the tester interface 220 includes a transmit tester buffer and a receive tester buffer that are operable to process the first and second plurality of test signals 124 and 126. As described above, processing of the first and second plurality of test signals 124 and 126 may include performing signal processing functions such as level shifting, and transmitting or receiving or both. In an embodiment, the control signal 216 may be used to disable the tester interface 220. The disabling of the tester interface 220 results in disabling a flow of test signals between the tester interface 220 and the tester 110 by creating a high impedance between the two. Thus, the direction of the flow of data or test signals on the bus 212 is controlled by individually controlling the device interface 210 and the tester interface 220.

In the depicted embodiment, a memory module 250 includes an input 252 that is coupled to the bus 212 to receive data or test signal inputs, and an output 254 that is also coupled to the bus 212 to provide data or test signal outputs. That is, the memory module 250 includes the input 252 to receive the first and second plurality of test signals 124 and 126 from the bus 212 and includes the output 254 to provide the stored value of the first and second plurality of test signals 124 and 126 to the bus 212. The memory module 250 receives a control signal 256 that controls the operation of the module and a clock signal 258 that determines a clock rate for transfer of data or test signals on the bus 212. In a particular embodiment, the memory module is a first-in-first-out (FIFO) memory device. The storage capacity and clock speed of the memory module 250 may be selected depending on the application. In a particular embodiment, the clock speed of the FIFO may be selected to match one of the device clock speed and the tester clock speed by using the clock signal 258. The capacity of the memory module 250, which may be sufficient to store N samples of test signals (N being an integer), may be selected to vary from 128K to 1024K.

In the depicted embodiment, a controller 260 includes a mode controller 272 operable to receive tester control signals 276, and provide outputs to control the operating states of the test module 120 and a clock logic circuit 270 that controls clock speed for the test module 120. In an embodiment, the tester controls signals 276 may be included in the electrical couplers 122. FIG. 2B illustrates additional details of the multiple operating states for the test module 120. Referring back to FIG. 2A, the operating states are controlled by the mode controller 272 by controlling the operation of the device interface 210 by control signal 214, the tester interface 220 by control signal 216, the memory module 250 by control signal 256, and the clock signal 258. The clock logic circuit 270 is operable to receive a device clock signal 262 from the device clock 192 at the device clock speed, a tester clock signal 264 from the tester clock 112 at the tester clock speed, and a clock control signal 274 from the mode controller 272. In response to these inputs, the clock logic circuit 270 provides the clock signal 258 to the memory module 250 to select one of the device clock speed and the tester clock speed. The memory module 250 is thus operable to read stored values of the test signals at one of the tester clock speed and the device clock speed. The clock speed for the memory module 250 is also the clock speed for the bus 212. In an embodiment, the controller 260 may be optionally coupled to a computer 290 via a communications bus 292 for performing debugging, measurement, and analysis of the test module 200.

FIG. 2B illustrates a plurality of operating modes of the test module 120 described with reference to FIGS. 1 and 2A, according to an embodiment. In the depicted embodiment, a table 202 illustrates four operating modes of the test module 120. In an embodiment, the operating modes of the test module 120 may be the same as the operating modes of the test system 100. In a first mode 203 of operation (e.g., capture mode), data is captured from the device 190 and provided to the memory module 250, the tester interface 220 is disabled, the flow of data or test signals is from the device interface 210 to the memory module on the bus 212, and the clock rate of the bus 212 is the same as the speed of the device clock 192. In a second mode 205 of operation (e.g., source mode), data is sourced or read from the memory module 250 (stored as N samples) and provided to the device 190, the tester interface 220 is disabled, the flow of data is from the memory module 250 to the device interface 210 on the bus 212, and the clock rate of the bus 212 is the same as the speed of the device clock 192. In a third mode 207 of operation, captured data is read from the memory module 250 (stored as N samples) and provided to the tester 110, the flow of data is from the memory module 250 to the tester interface 220 on the bus 212, the device interface 210 is disabled, and the clock rate of the bus 212 is the same as the speed of the tester clock 112. In a fourth mode 209 of operation (e.g., source mode), data is sourced from the tester 110 and provided to the memory module 250 (to be stored as N samples), the flow of data is from the tester interface 220 to the memory module on the bus 212, the device interface 210 is disabled, and the clock rate of the bus 212 is the same as the speed of the tester clock 112. In an exemplary, non-depicted embodiment, the test module 120 may be operable is a by-pass mode, e.g., when the speed of the device clock 192 is selected to be less than 30 MHz.

Figure 3:
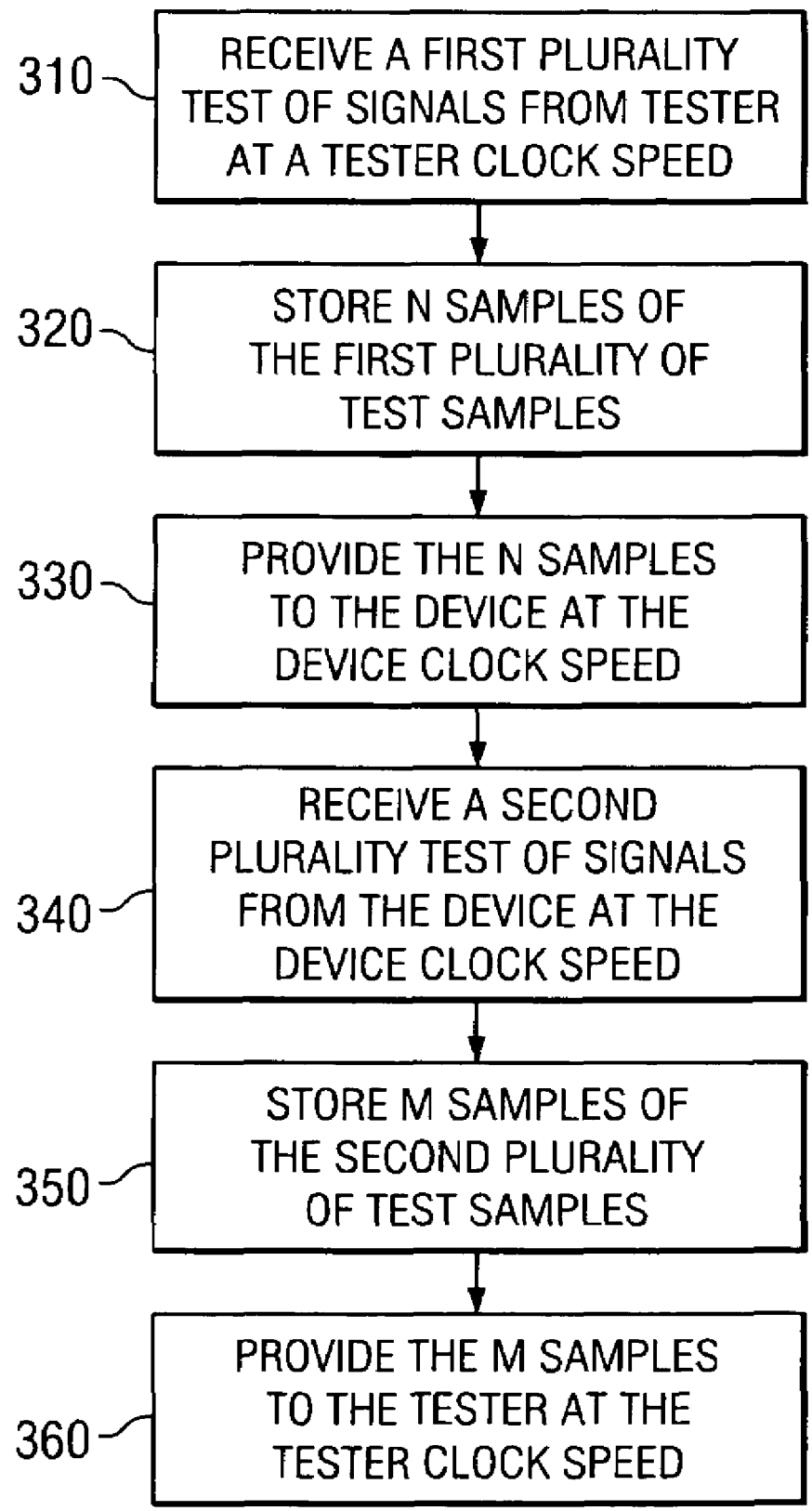
FIG. 3 is a flow chart illustrating a method for testing a device, according to an embodiment.

FIG. 3 is a flow chart illustrating a method for testing a device, according to an embodiment. In a particular embodiment, the device is substantially the same as the device 190 being tested by the test system 100 described with reference to FIG. 1. At step 310, a first plurality of test signals are received from a tester at a tester clock speed, where the tester is operable at the tester clock speed and the tester is communicating the first plurality of test signals at the tester clock speed. At step 320, N values or samples of the first plurality of test signals (N being an integer) are stored, e.g., in the memory module 250 described with reference to FIG. 2A. The value of N may be selected depending on factors such as the size of the memory module, the device clock speed, and the tester clock speed. At step 330, the N samples that are stored are provided to the device at the device clock speed. The device is operable at the device clock speed, which is greater than the tester clock speed. At step 340, a second plurality of test signals are received from the device at a device clock speed, the device being operable at the device clock speed. At step 350, M values or samples of the second plurality of test signals (M being an integer) are stored, e.g., in the memory module 250 described with reference to FIG. 2A. The value of M, which may be different than N due to the difference in the device clock speed and the tester clock speed, may be selected depending on factors such as the size of the memory module, the device clock speed, and the tester clock speed. At step 360, the M samples that are stored are provided to the tester at the tester clock speed, the tester clock speed being less than the device clock speed.

Various steps described above may be added, omitted, combined, altered, or performed in different orders. For example, steps 340, 350, and 360 may be deleted if the device is to be tested for digital sourcing.

Several advantages are achieved by the method and system according to the illustrative embodiments presented herein. The embodiments advantageously provide a VLCT with a test module to reliably, consistently, and efficiently capture or source high speed data for testing a DUT, especially when the clock rate of the DUT exceeds the limitations of the VLCT. By receiving, and storing samples of the test signals, the test module advantageously decouples time synchronization between the DUT, and the VLCT by delivering the stored samples at a clock rate matching the 'at speed' clock rate of the DUT or the VLCT tester. This advantageously enables at speed communication with the tester as well as with the DUT, thereby enabling the at speed testing of analog-to-digital converters (ADC) and digital-to-analog converters (DAC) included in the DUT. The test module may also be advantageously be used with high speed testers to advantageously decouple time synchronization between the DUT and the high speed tester, and avoid failures if the DUT clock has jitter (has abrupt and undesirable variations in one or more clock signal characteristics). The test module thus virtually eliminates need to synchronize clocks between DUT and the high speed tester. Chip manufacturing facilities may add the improved test module to a new or a legacy test system or to both to obtain reliable test data and reduce the overall test time, thereby reducing the overall testing costs, and enabling increased production.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of a VLCT system, those of ordinary skill in the art will appreciate that the processes disclosed are capable of being implemented using any tester and any DUT, especially when the clock rate of the DUT exceeds the limitations of the tester.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A test system comprising:
    a tester, the tester having an internal tester clock operable at a tester clock speed, the tester operable to communicate a first plurality of test signals at the tester clock speed;
    a device for testing, the device having an internal device clock operable at a device clock speed, the device being operable to use the device clock to communicate a second plurality test signals at the device clock speed, wherein the device clock speed is greater than the tester clock speed; and
    a test module located on an interface board, the interface board being removably secured to a test head, the test module being electrically coupled to the tester and to the device, wherein the test module includes:
    a bus to communicate the first and second plurality of test signals between the tester and the device;
    a memory module coupled to the bus, the memory module being operable to store the first plurality of test signals at the tester clock speed and the second plurality of test signals at the device clock speed; and
    a controller operable to control the flow of the first and second plurality of test signals through the device interface and the tester interface, wherein the device interface is disabled when the bus operates at the tester clock speed, wherein the tester interface is disabled when the bus operates at the device clock speed.

2. The system of claim 1, wherein the memory module is further operable to read stored values of the first and second plurality of test signals at one of the tester clock speed and the device clock speed.

3. The system of claim 1, wherein the bus is coupled to the device by a device interface, and coupled to the tester by a tester interface, wherein the device interface and the tester interface are operable to control flow of the first and second plurality of test signals.

4. The system of claim 1, wherein the controller includes:
    a mode controller operable to control a plurality of operating modes including a source mode and a capture mode, wherein in the source mode the bus operates at the tester clock speed, wherein in the capture mode the bus operates at the device clock speed; and
    a clock control signal operable to select one of the tester clock speed and the device clock speed corresponding to one of the plurality of operating modes.

5. The system of claim 1, wherein a distance between the device and the test module is limited to 1 meter.

6. The system of claim 1, wherein the device is located on the interface board.

7. The system of claim 1, wherein the memory module has a capacity to store N samples of the first and second plurality of test signals, wherein the N samples are accessible to the tester at the tester clock speed, and the N samples are accessible to the device at the device clock speed, N being an integer.

8. The system of claim 1, wherein the device is one of a microprocessor, a digital signal processor, a radio frequency chip, a memory, a microcontroller and a system-on-a-chip or a combination thereof.

9. A test module for testing a device, the test module comprising:
    a device interface capable of communicating a second plurality of test signals with the device having an internal device clock operable at a device clock speed;
    a tester interface capable of communicating a first plurality of test signals with a tester at a tester clock speed;
    a bus to electrically couple the device interface and the tester interface, the bus operable to communicate the first and second plurality of test signals between the device and the tester at one of the tester clock speed and the device clock speed;
    a memory module coupled to the bus, the memory module being operable to read or write the first plurality of test signals at the tester clock speed and the second plurality of test signals at the device clock speed; and
    a controller operable to control the flow of the first and second plurality of test signals through the device interface and the tester interface, wherein the device interface is disabled when the bus operates at the tester clock speed, wherein the tester interface is disabled when the bus operates at the device clock speed.

10. The test module of claim 9, wherein the device is one of a microprocessor, a digital signal processor, a radio frequency chip, a memory, a microcontroller and a system-on-a-chip or a combination thereof.

11. The test module of claim 9, wherein the memory module has a capacity to store N samples of the first and second plurality of test signals, wherein the N samples are accessible to the tester at the tester clock speed, and accessible to the device at the device clock speed, N being an integer.

12. The test module of claim 9, wherein a distance between the device and the test module is limited to 1 meter.

13. The test module of claim 9, wherein the device and the test module are located on an interface board, the interface board being removably secured to a test head.

14. The test module of claim 9, wherein the controller includes:
    a mode controller operable to control a plurality of operating modes including a source mode and a capture mode, wherein in the source mode the bus operates at the tester clock speed, wherein in the capture mode the bus operates at the device clock speed; and
    a clock control signal operable to select one of the tester clock speed and the device clock speed corresponding to one of the plurality of operating modes.

* * * * *

UNITED STATES PATENT AND TRADEMARK OFFICE
CERTIFICATE OF CORRECTION

PATENT NO. : 7,640,471 B2  Page 1 of 1
APPLICATION NO. : 11/580761
DATED : December 29, 2009
INVENTOR(S) : Miao et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 470 days.

Signed and Sealed this

Twenty-first Day of December, 2010

David J. Kappos
*Director of the United States Patent and Trademark Office*